United States Patent
Nishide

(10) Patent No.: US 8,262,799 B2
(45) Date of Patent: Sep. 11, 2012

(54) SUBSTRATE PROCESSING APPARATUS AND SUBSTRATE TRANSFERRING METHOD

(75) Inventor: Nobuhiko Nishide, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 793 days.

(21) Appl. No.: 11/689,194

(22) Filed: Mar. 21, 2007

(65) Prior Publication Data

US 2007/0227444 A1  Oct. 4, 2007

(30) Foreign Application Priority Data

Mar. 28, 2006  (JP) .................................. 2006-89049

(51) Int. Cl.
*H01L 21/68* (2006.01)
*H01L 21/027* (2006.01)

(52) U.S. Cl. ............... 118/730; 156/345.55; 156/345.23

(58) Field of Classification Search .................. 118/500, 118/52, 730; 156/345.55, 345.23
See application file for complete search history.

(56) References Cited

U.S. PATENT DOCUMENTS

| 5,376,216 | A | 12/1994 | Yoshioka et al. | |
| 7,811,412 | B2 * | 10/2010 | Miya et al. | 156/345.55 |
| 2004/0159343 | A1 | 8/2004 | Shimbara et al. | |
| 2005/0276921 | A1 | 12/2005 | Miya et al. | |

FOREIGN PATENT DOCUMENTS

| CN | 1714952 A | 1/2006 |
| JP | 63-300835 | 12/1988 |
| JP | 6-291030 | 10/1994 |
| JP | 9-232405 | 9/1997 |
| JP | 11-8287 | 1/1999 |
| JP | 2002-151577 | 5/2002 |
| JP | 2002-176093 | 6/2002 |
| JP | 2002-264065 | 9/2002 |
| JP | 2004-165284 | 6/2004 |
| JP | 2004-253756 | 9/2004 |
| JP | 2004-266202 | 9/2004 |

OTHER PUBLICATIONS

Chinese Office Action issued on Jun. 12, 2009 in connection with corresponding Chinese Patent Application No. 2007-10091404.6.
Chinese Office Action issued on Aug. 22, 2008 in connection with corresponding Chinese Patent Application No. 2007100914046.
Japanese Notification of Reason of Refusal issued Sep. 30, 2010 in corresponding Japanese Patent Application No. 2006-089049.

* cited by examiner

*Primary Examiner* — Sylvia R. MacArthur
(74) *Attorney, Agent, or Firm* — Ostrolenk Faber LLP

(57) ABSTRACT

A substrate processing apparatus includes a substrate holding and rotating mechanism for holding and rotating a substrate; a positioning member disposed on the substrate holding and rotating mechanism for positioning a substrate at a predetermined substrate holding position; a substrate transfer mechanism for transferring a substrate to the substrate holding and rotating mechanism; and a pressing unit disposed on the substrate transfer mechanism for pressing a substrate toward the positioning member.

9 Claims, 7 Drawing Sheets

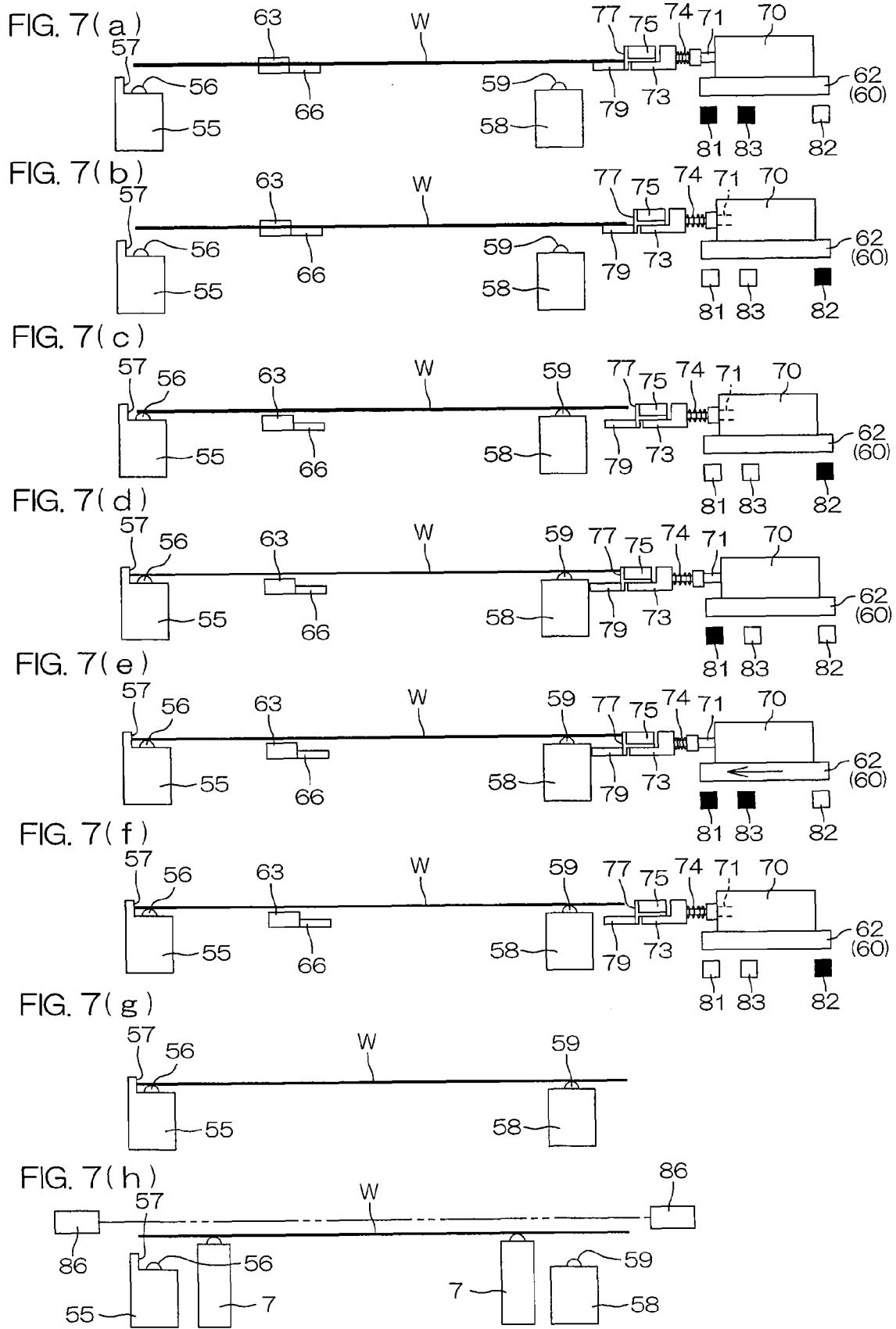

SUBSTRATE PROCESSING APPARATUS AND SUBSTRATE TRANSFERRING METHOD

BACKGROUND OF THE INVENTION

1. Field of the Invention

The present invention relates to a substrate processing apparatus for processing a substrate while the substrate is held by a substrate holding and rotating mechanism, and also to a substrate transferring method in such a substrate processing apparatus. Examples of the substrate to be processed or transferred include a semiconductor wafer, a liquid crystal display substrate, a plasma display substrate, an FED (Field Emission Display) substrate, an optical-disk substrate, a magnetic-disk substrate, a magneto-optical-disk substrate, a photomask substrate and the like.

2. Description of Related Art

A substrate processing apparatus for processing a substrate such as a semiconductor wafer or the like, has a spin chuck for holding and rotating a substrate, and a treatment liquid nozzle for supplying a treatment liquid to the substrate held by the spin chuck. The spin chuck includes a disk-like base member, and a plurality of holding pins which stand from the peripheral edge of the base member and which are arranged to come in contact with the peripheral end face of a substrate, thereby to hold the substrate.

According to the above-mentioned arrangement, however, the portions of the substrate peripheral end face coming in contact with the holding pins remain unprocessed. Such unprocessed portions are a problem, particularly in a bevel etching or a bevel washing treatment for removing an unnecessary copper film and copper ions at the substrate peripheral edge and on the peripheral end face after the copper film is formed on the substrate surface. Such unprocessed portions may provoke a metal contamination to a substrate holding hand when the substrate is thereafter transferred by a substrate transfer robot. Then such metal contamination may be further transferred to other substrate, causing a diffusion of metal contamination to various components of the substrate processing apparatus.

To overcome the above-mentioned problem, the prior art disclosed in the U.S. Patent Application Publication No. US 2005/276921 A1 proposes an arrangement in which a substrate is supported from the underside thereof by a substrate supporting member implanted in a rotary base member, while the substrate is pushed to the substrate supporting member by supplying gas onto the top of the substrate, so that the substrate is rotated while being held by the friction between the substrate supporting member and the substrate.

According to the above-mentioned arrangement, however, it is essential that the substrate is supported in an accurate alignment, on the substrate supporting member. If the axis of rotation of the rotary base member is not aligned with the gravity center of the substrate, the substrate tends to move horizontally by the centrifugal force with the rotation. This may cause unstablity for holding the substrate.

It is therefore proposed that in the course of the transfer of a substrate by a substrate transfer robot, the substrate is aligned with the substrate holding hand or an unprocessed substrate is once carried in an alignment stage for alignment thereof. It is also proposed to use a substrate transfer robot of high precision to secure the necessary positional precision.

However, any of these measures is highly expensive and is therefore not preferable. Further, it is practically impossible to achieve the necessary positional precision due to tolerance of the parts and variations of assembling thereof.

SUMMARY OF THE INVENTION

It is an object of the present invention to provide a substrate processing apparatus and a substrate transfer method both of which are capable of, yet restraining the cost, holding a substrate in a precise position positioned by a substrate holding and rotating mechanism, thereby to achieve a stable substrate processing.

A substrate processing apparatus according to the present invention comprises: a substrate holding and rotating mechanism (4) for holding and rotating a substrate (W); a positioning member (55,57) provided on the substrate holding and rotating mechanism for positioning the substrate at a predetermined substrate holding position; a substrate transfer mechanism (52) for transferring the substrate to the substrate holding and rotating mechanism; and a pressing unit (53,60, 70,75,77) disposed on the substrate transfer mechanism for pressing the substrate toward the positioning member. In this chapter SUMMARY OF THE INVENTION, the alphanumeric characters in parentheses represent the corresponding component elements and the like in the embodiments to be discussed later. However, this does not mean that the present invention is construed as limited only to these embodiments.

According to the above-mentioned arrangement, a substrate is pressed to the positioning member disposed on the substrate holding and rotating mechanism by the pressing unit disposed on the substrate transfer mechanism. Accordingly, the substrate can be accurately positioned with respect to the substrate holding and rotating mechanism when the substrate is transferred from the substrate transfer mechanism to the substrate holding and rotating mechanism.

Since the positioning member is disposed on the substrate holding and rotating mechanism, the substrate can be precisely positioned as compared with the arrangement in which the substrate is positioned on the substrate holding hand or on the positioning stage, thus resulting in reduction in cost.

The pressing unit may comprise: a substrate contact portion (75, 77) to come in contact with the end face of a substrate; and a substrate-contact-portion moving mechanism (53, 70) for moving the substrate contact portion toward the positioning member. According to the above-mentioned arrangement, the substrate-contact-portion moving mechanism moves the substrate contact portion toward the positioning member, causing the substrate to be moved toward the positioning member where the substrate is positioned.

It is preferable that a control unit (20) is further disposed for controlling the substrate-contact-portion moving mechanism in the above-mentioned manner, when a substrate is transferred from the substrate transfer mechanism to the substrate holding and rotating mechanism (more specifically, immediately after or before the transfer).

Further, since the substrate contact portion is moved by the substrate-contact-portion moving mechanism, it is preferable that the substrate contact portion further comprises a biasing unit (74) for resiliently pushing a substrate toward the positioning member. The biasing unit may be, for example, a resilient member such as a spring or the like.

When the substrate transfer mechanism comprises a substrate holding hand (60) for holding a substrate, it is preferable that the substrate contact portion is disposed on the substrate holding hand, and the substrate-contact-portion moving mechanism comprises a hand driving mechanism (53) for moving the substrate holding hand toward the positioning member. According to the above-mentioned arrangement, by moving the substrate holding hand toward the positioning member by the hand driving mechanism, the substrate contact portion can be moved, whereby the substrate can be accurately positioned with respect to the substrate holding and rotating mechanism.

Further, the substrate-contact-portion moving mechanism may comprise a relative moving mechanism (70) for relatively moving the substrate contact portion with respect to the substrate holding hand. According to the above-mentioned arrangement, a substrate can be moved toward the positioning member both by the movement of the substrate holding hand by the hand driving mechanism and by the relative movement of the substrate contact portion by the relative moving mechanism. Accordingly, even though the moving precision of the substrate holding hand by the hand driving mechanism is insufficient, the substrate contact portion can be moved more precisely by the relative moving mechanism. As a result, an expensive high-precision hand driving mechanism is not required, thus contributing to reduction in cost.

When the substrate transfer mechanism comprises a substrate holding hand (60) for holding a substrate, the substrate contact portion may be disposed on the substrate holding hand and the substrate-contact-portion moving mechanism may comprise a relative moving mechanism (70) for relatively moving the substrate contact portion with respect to the substrate holding hand. According to the above-mentioned arrangement, a substrate can be moved toward the positioning member by the relative movement of the substrate contact portion by the relative moving mechanism. Accordingly, even though the moving precision of the substrate holding hand by the hand driving mechanism is insufficient, the substrate contact portion can be moved more precisely by the relative moving mechanism. As a result, an expensive high-precision hand driving mechanism is not required, contributing to reduction in cost.

It is preferable that the substrate processing apparatus further comprises a to-be-positioned substrate supporting portion (56,59; 66,79) for supporting a substrate such that the substrate is movable toward the positioning member at the position where the end face of the substrate is opposite to the positioning member. According to the above-mentioned arrangement, the substrate can be positioned while stably supported by the to-be-positioned substrate supporting member The to-be-positioned substrate supporting portion (56, 59) may be disposed on the substrate holding and rotating mechanism. According to the above-mentioned arrangement, a substrate can be positioned after the substrate is delivered from the substrate transfer mechanism to the substrate holding and rotating mechanism.

The to-be-positioned substrate supporting portion (66, 79) may be disposed on the substrate transfer mechanism. According to the above-mentioned arrangement, a substrate can be positioned before the substrate is transferred from the substrate transfer mechanism to the substrate holding and rotating mechanism. In this case, the to-be-positioned substrate supporting portion may be disposed on the substrate holding hand for holding a substrate.

It is preferable that the substrate holding and rotating mechanism comprises a to-be-processed substrate supporting portion (7) for supporting a substrate by coming in contact with one surface of the substrate when the substrate is processed. In particular, it is preferable that the substrate holding and rotating mechanism is arranged to hold a substrate by supporting the substrate from the one-surface side by the to-be-processed substrate supporting portion without contacting with the end face of the substrate.

The above-mentioned arrangement restrains or prevents the end face of a substrate from remaining partially unprocessed. Further, since the substrate is accurately positioned with respect to the substrate holding and rotating mechanism, the substrate can stably be held even though the substrate is under rotation.

The substrate processing apparatus may further comprise a fluid supply unit (21, 9b) for supplying a fluid (gas or liquid) to the other surface of the substrate supported by the to-be-processed substrate supporting portion to press the substrate to the to-be-processed substrate supporting portion.

According to the above-mentioned arrangement, the fluid presses the substrate to the to-be-processed substrate supporting portion and the substrate is accurately positioned with respect to the substrate holding and rotating mechanism. Accordingly, even though the substrate holding and rotating mechanism has no other substrate contact portion than the to-be-processed substrate supporting portion, the substrate can be stably held.

The substrate holding and rotating mechanism may further comprise a base (5) and a support driving mechanism (28, 29, 30: more specifically, a mechanism capable of moving the to-be-processed substrate supporting portion to change the distance between the base surface and the support position). Such an arrangement enables a substrate to be transferred from the to-be-positioned substrate supporting portion to the to-be-processed substrate supporting portion.

The to-be-processed substrate supporting portion may also serve as the to-be-positioned substrate supporting portion.

A substrate transferring method according to the present invention comprises the steps of: disposing a positioning member (55) on a substrate holding and rotating mechanism (4), the positioning member being arranged to position a substrate (W) at a predetermined substrate holding position, the substrate holding and rotating mechanism being arranged to hold and rotate a substrate; pressing a substrate to the positioning member by a pressing unit (53, 60, 70, 75, 77) disposed on a substrate transfer mechanism (52) arranged to transfer a substrate to the substrate holding and rotating mechanism; and transferring a substrate from the substrate transfer mechanism to the substrate holding and rotating mechanism. The variations discussed in connection with the invention of the substrate processing apparatus may be also applied to the method invention.

The foregoing and other objects, features, characteristics and advantages of the present invention will become more apparent from the following detailed description of the preferred embodiments with reference to the attached drawings.

BRIEF DESCRIPTION OF THE DRAWINGS

FIGS. 7 (*a*) to 7 (*h*) are schematic views successively illustrating the operational steps (according to a first embodiment) of transferring a substrate from the substrate holding hand to the spin chuck.

DESCRIPTION OF THE PREFERRED EMBODIMENTS

Figure 1:
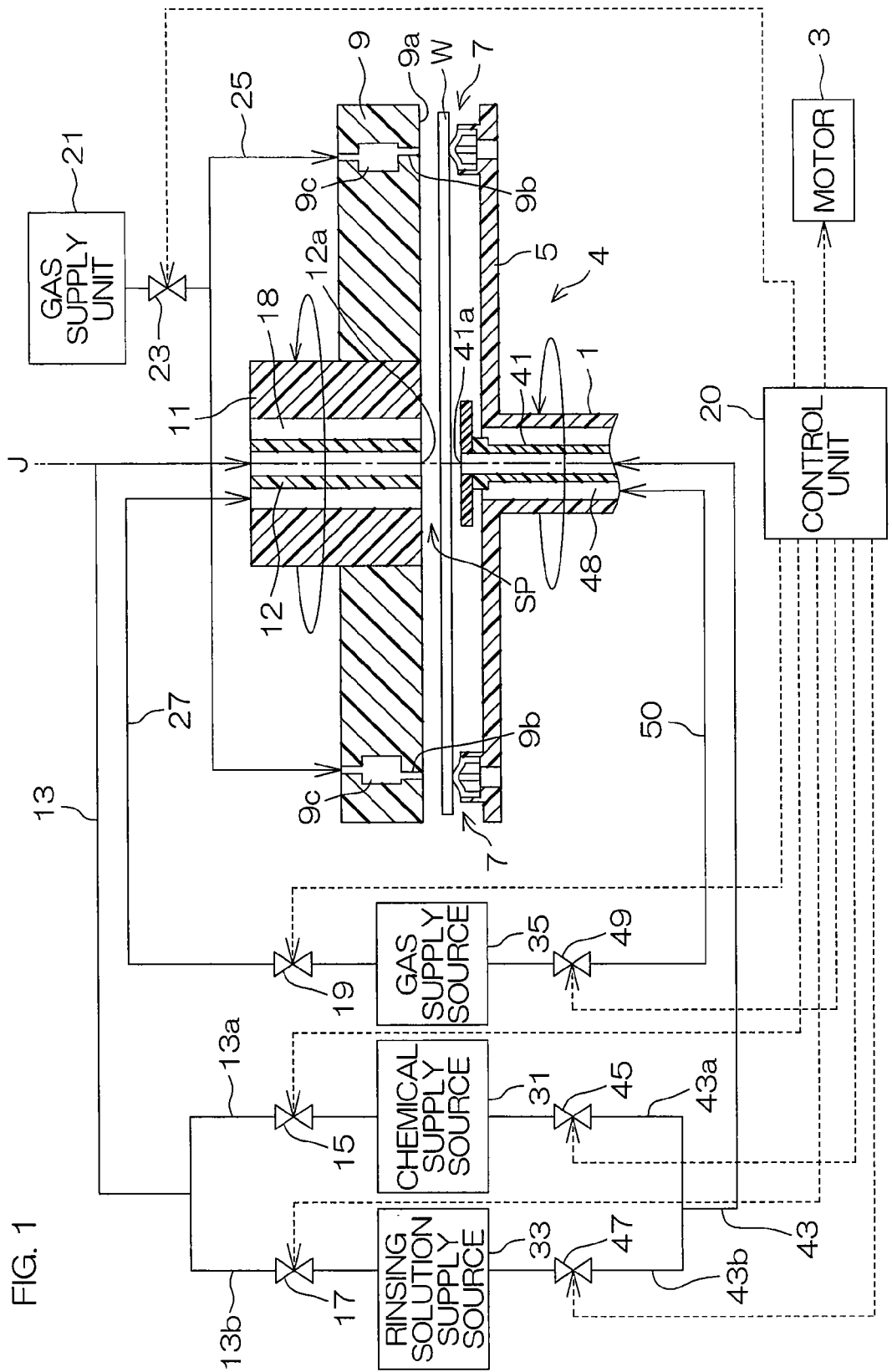
FIG. 1 is a schematic cross section view illustrating the arrangement of a substrate processing apparatus according to an embodiment of the present invention.

FIG. 1 is a schematic cross section view illustrating the arrangement of a substrate processing apparatus according to an embodiment of the present invention. This substrate processing apparatus is arranged to supply a treatment liquid such as a chemical, a rinsing solution (e.g., DI water (deionized water)) or the like to the surfaces of a substrate W such as a semiconductor wafer or the like, to execute liquid processing on the substrate W. Thereafter, the substrate is spin-dried to shake off the liquid on the substrate surfaces by a centrifugal force. This substrate processing apparatus is arranged to supply a treatment liquid to the underside of a substrate W, whereby the underside can be processed. Further, supplying the treatment liquid to the underside of the substrate W allows the treatment liquid to run round up to the top surface of the substrate (device forming face) along its peripheral end face from the underside, whereby the peripheral edge of the top of the substrate W can be processed (bevel processing). Further, with the treatment liquid supplied to the top substrate W, the top can be processed.

The substrate processing apparatus includes a hollow rotary shaft 1 that is connected to the rotary shaft of a motor 3, whereby the rotary shaft 1 is rotatable around the vertical axis of rotation J by driving the motor 3. A spin base 5 is connected to the upper end of the rotary shaft 1 in a unitary structure. Accordingly, the spin base 5 is rotatable around the axis of rotation J by driving the motor 3. In the vicinity of the peripheral edge of the spin base 5, a plurality of support units 7 projecting upwardly from the spin base 5. The support units 7 are arranged to support a substrate W and come in contact with the peripheral edge of the underside thereof. The plurality of support units 7 support the substrate W horizontally in a separated state by a predetermined distance from the spin base 5. The support units 7, the spin base 5 and the like form a spin chuck 4 serving as a substrate holding and rotating mechanism for holding and rotating a substrate W.

Figure 2:
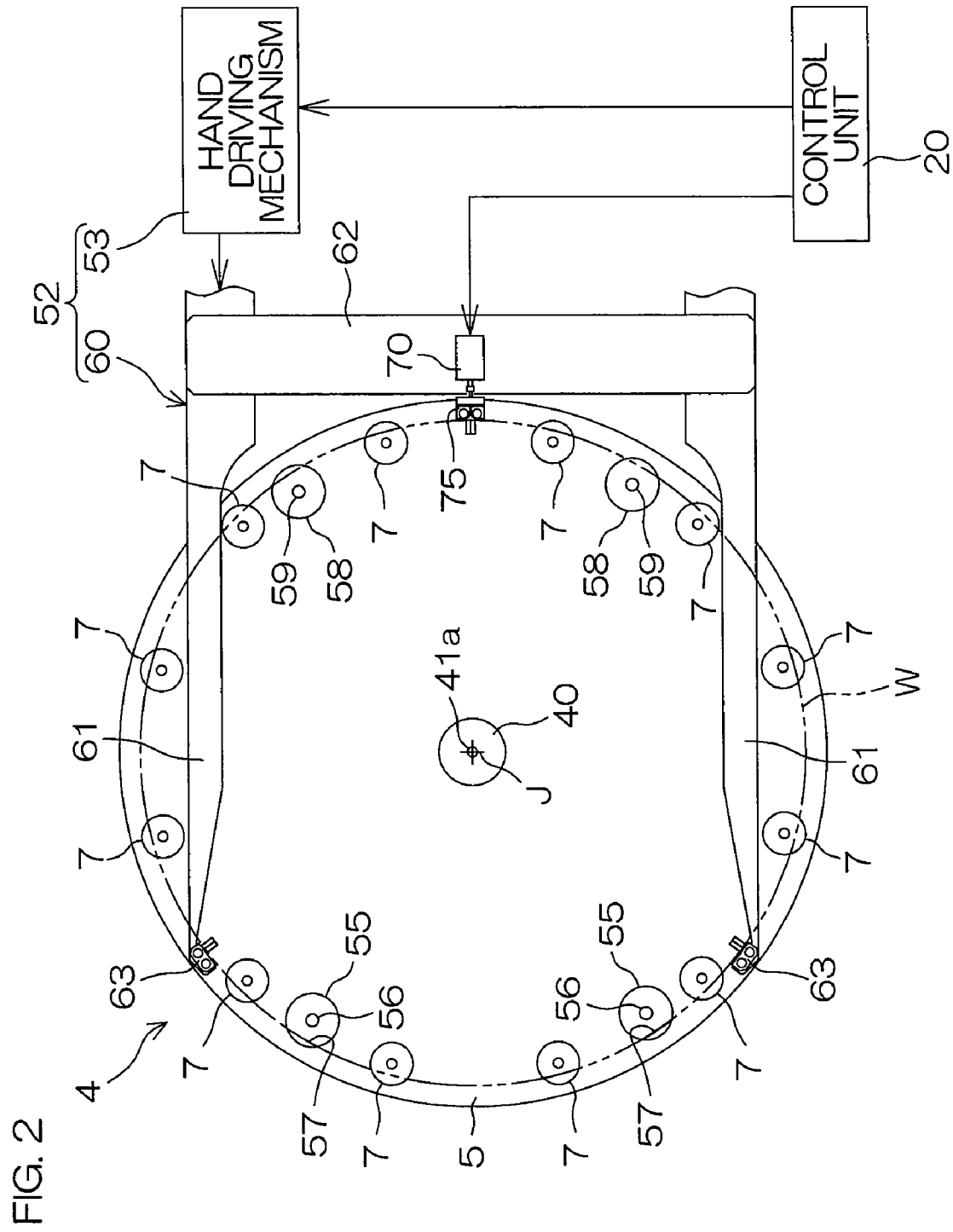
FIG. 2 is a plan view of the spin chuck provided on the substrate processing apparatus, illustrating how a substrate is carried in by the substrate holding hand.

FIG. 2 is a plan view of the spin chuck 4 as viewed from above, illustrating the state where a substrate W is carried in by a substrate holding hand 60 of a substrate transfer robot 52. The spin base 5 is provided with an opening in the center thereof, and with a plurality of (twelve in this embodiment) support units 7 (to-be-processed substrate support units) in the vicinity of the peripheral edge thereof. Twelve support units 7 are disposed radially at regular angular intervals of 30 degree around the axis of rotation J.

In order to horizontally hold a substrate W, it is sufficient to dispose at least three support units 7. However, in order to process the portions of the underside of a substrate W with which the support units 7 come in contact, it is desired that the support units 7 are operable to contact to and space apart from the underside of the substrate W and that each of the support units 7 is separated from the underside of the substrate W at least once during the processing. Accordingly, at least four support units 7 are required for processing the underside of the substrate W in its entirety including the portions of the underside of the substrate W with which the support units 7 come in contact.

According to this embodiment, for example, twelve support units 7 are divided into two groups each consisting of alternate six support units 7 to operate such that the substrate W is supported alternately by the two groups of the support units 7 while the substrate W is processed with the treatment liquid.

As shown in FIG. 1, the substrate processing apparatus has an atmosphere blocking plate 9 arranged opposite to the spin base 5 for blocking the atmosphere above the top of the substrate W, and a gas supply unit 21 (fluid supply unit) for supplying inert gas such as nitrogen gas or the like into a space SP defined between the atmosphere blocking plate 9 and the top of the substrate W. By supplying inert gas into the space SP toward the top of the substrate W from the gas supply unit 21, the substrate W can be pressed to the support units 7, thus enabling the substrate W to be held by the spin chuck 4. Accordingly, the rotational force of the spin chuck 4 is transmitted to the substrate W through the support units 7 by the frictional force between the support units 7 and the underside of the substrate W.

The atmosphere blocking plate 9 is attached to the lower end of a hollow cylindrical support shaft 11 rotatably together. A blocking plate driving mechanism (omitted) is coupled to the support shaft 11. By driving the motor of the blocking plate driving mechanism, the atmosphere blocking plate 9 is configured to be rotated together with the support shaft 11 around the axis of rotation J coaxial with the rotary shaft 1 of the spin chuck 4. The control unit 20 controls the motor of the blocking plate driving mechanism so as to synchronize with the motor 3, so that the atmosphere blocking plate 9 can be rotationally driven in the same direction and at the same rotational speed as those of the spin chuck 4. Further, the actuation of the vertical movement driving actuator (e.g., air cylinder) of the blocking plate driving mechanism enables to move the atmosphere blocking plate 9 toward or away from the spin base 5.

The atmosphere blocking plate 9 is slightly larger than the substrate W in diameter, and has an opening in the center. The atmosphere blocking plate 9 is disposed above the spin chuck 4 and the underside (bottom face) thereof is an opposed face 9*a* arranged to face the top of the substrate W. The opposed face 9*a* has a plurality of gas ejection holes 9*b*. The plurality of gas ejection holes 9*b* are disposed at the positions corresponding to the support units 7 disposed on the spin base 5, more specifically, at regular spatial intervals along the circumference around the axis of rotation J on the rotational trajectory of the support units 7. These gas ejection holes 9*b* communicate with gas flow spaces 9*c* inside of the atmosphere blocking plate 9. Not limited to a plurality of gas ejection holes, there may be used a single gas ejection hole, for example, in the form of a ring-like opening along the entire circumference of the plate 9 with the axis of rotation J serving as the center. However, the arrangement of a plurality of gas ejection holes 9*b* is more advantageous in view of uniform gas ejection pressure.

In order to supply gas to the gas flow spaces 9*c* formed inside of the atmosphere blocking plate 9, the gas flow spaces 9*c* communicate with and are connected to the gas supply unit 21 through a piping 25. The piping 25 is provided with an on-off valve 23 controlled on/off by the control unit 20. Accordingly, the control unit 20 opens the on-off valve 23 to supply inert gas such as nitrogen gas or the like to the gas flow spaces 9*c* from the gas supply unit 21. This ejects the inert gas toward the top of the substrate W from the plurality of gas ejection holes 9b. The plurality of gas ejection holes 9b are formed in the opposed face 9a of the atmosphere blocking plate 9 so as to be arranged on the rotational trajectory of the support units 7 to eject the inert gas substantially in the vertical direction. The inert gas from the plurality of gas ejection holes 9b may not be supplied onto the rotational trajectory, but may be supplied inwardly or outwardly in the radial direction with respect to the rotational trajectory of the support units 7.

As the inert gas is ejected uniformly from each of the plurality of gas ejection holes 9b, the substrate W is uniformly pushed to each of the support units 7 upwardly projectingly disposed on the spin base 5. Accordingly, the substrate W is held horizontally by the spin chuck 4.

An upper cleaning nozzle 12 is coaxially disposed in the center opening of the atmosphere blocking plate 9 and in the hollow portion of the support shaft 11. A nozzle outlet 12a is configured at the lower end of the nozzle 12 to supply a treatment liquid such as a chemical, a rinsing solution or the like into the vicinity of the axis of rotation of the top of the substrate W pressingly held by the spin base 5. The upper cleaning nozzle 12 communicates with and is connected to a piping 13. The piping 13 is branched at the base portion thereof. A chemical supply source 31 is connected into one branch piping 13a and a rinsing solution supply source 33 is connected into the other branch piping 13b. On-off valves 15, 17 are respectively interposed in the branch pipings 13a, 13b. The on-off valves 15, 17 are controlled by the control unit 20 arranged to control the apparatus in its entirety, so that the chemical or the rinsing solution can selectively be supplied onto the top of the substrate W from the upper cleaning nozzle 12.

The gap between the inner wall of the hollow portion of the support shaft 11 and the outer wall of the upper cleaning nozzle 12 forms a gas supply passage 18. This gas supply passage 18 is continuously connected to a gas supply source 35 through a piping 27 having an on-off valve 19. After the processings with the chemical and the rinsing solution by the upper cleaning nozzle 12, the on-off valve 19 is turned on/off by the control unit 20 such that gas such as a cleaned air, inert gas or the like is supplied through the gas supply passage 18 into the space SP between the top of the substrate W and the opposed face 9a of the atmosphere intercepting plate 9. This enables to dry the substrate W.

In the hollow portion of the rotary shaft 1, a lower cleaning nozzle 41 is coaxially disposed so that a nozzle outlet 41a at the upper end thereof supplies a treatment liquid in the vicinity of the axis of rotation of the underside of the substrate W. The lower cleaning nozzle 41 communicates with and is connected to a piping 43. The piping 43 is branched at the base end thereof. The chemical supply source 31 is connected into one branch piping 43a and the rinsing solution supply source 33 is connected into the other branch piping 43b. On-off valves 45, 47 are respectively interposed in the branch pipings 43a, 43b. The on-off valves 45, 47 are controlled by the control unit 20 arranged to control the apparatus in its entirety, so that the chemical or the rinsing solution can selectively be supplied to the underside of the substrate W from the lower cleaning nozzle 41.

The gap between the inner wall of the rotary shaft 1 and the outer wall of the lower cleaning nozzle 41 forms a cylindrical gas supply passage 48. This gas supply passage 48 is continuously connected to the gas supply source 35 through a piping 50 having an on-off valve 49. The on-off valve 49 is turned on/off by the control unit 20 such that gas such as a cleaned air, inert gas or the like is supplied through the gas supply passage 48 into the space between the underside of the substrate W and the opposed face of the spin base 5.

Figure 3:
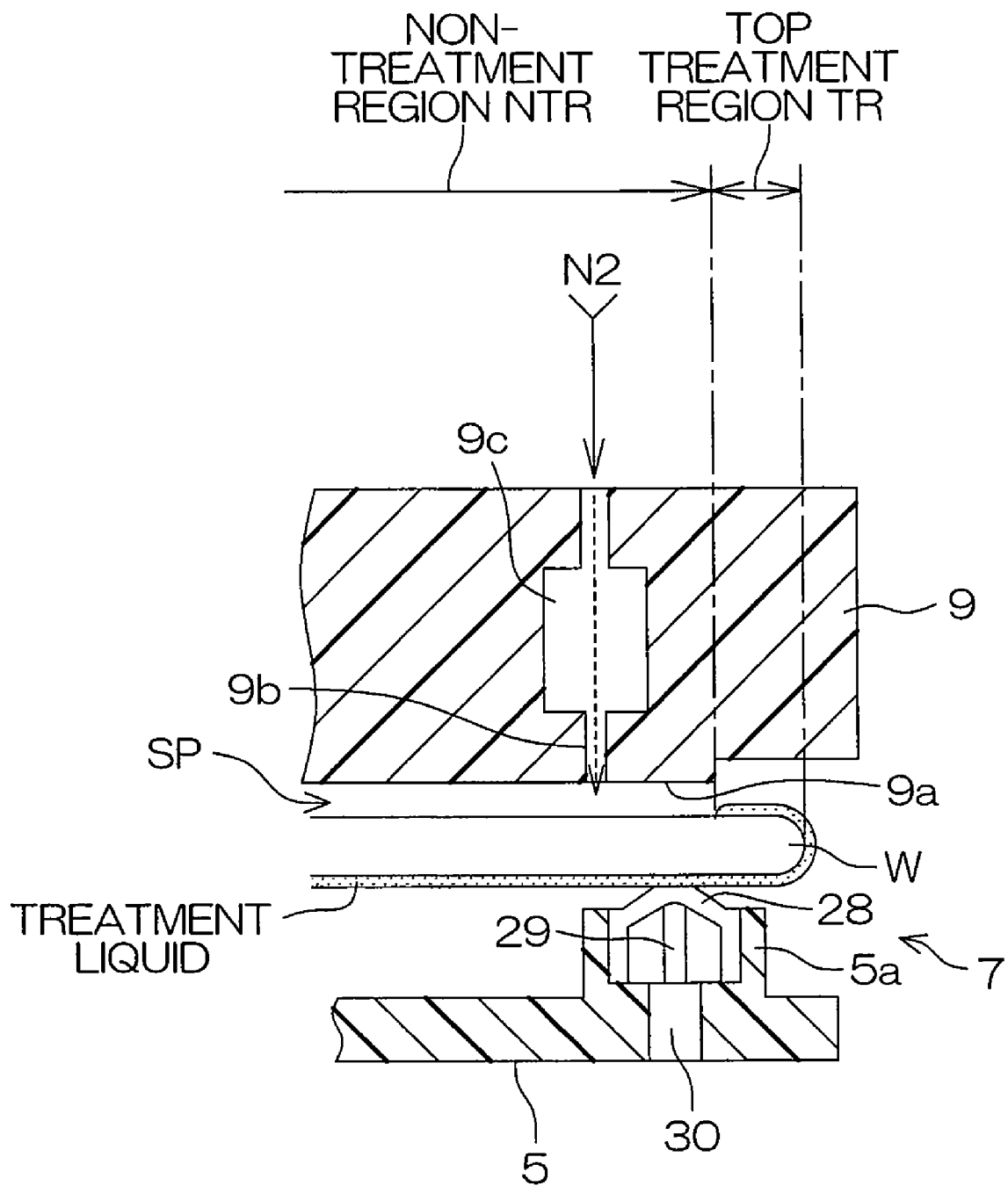
FIG. 3 is a partial cross section view illustrating the arrangement of the support unit disposed on the spin chuck.

FIG. 3 is a partial cross-section view illustrating the arrangement of the support unit 7. Since the plurality of support units 7 have the same arrangement, the description in the following will be made for one support unit 7 with reference to the drawing.

The support unit 7 is disposed inside of an extending portion 5a formed by a portion of the spin base 5 which upwardly extends in a protrusion form. The support unit 7 has: a film 28 embedded in the extending portion 5a of the spin base 5 such that the film 28 can come in contact with or be separated from the underside peripheral edge of the substrate W; a movable rod 29 which is vertically movably supported to come in contact with or be separated from the underside of the film 28 such that the film 28 is pushed up at the top center portion thereof; and a drive unit 30 such as a motor or the like for vertically moving the movable rod 29. An actuator of all type such as an air cylinder or the like may be used for the drive unit 30 instead of the motor. These movable rod 29, the drive unit 30 and the like form a supporting unit driving mechanism.

When the drive unit 30 upwardly drives the movable rod 29 through a drive coupling unit (not shown) by a drive signal from the control unit 20, the tip of the movable rod 29 comes in contact with the underside of the top of the cylindrical concave portion of the film 28, thereby pushing up the top center of the film 28. This projects the top of the film 28 embedded in the top side of the spin base 5 from the top of the extending portion 5a of the spin base 5. Accordingly, by projecting the films 28 (at least three films 28 or more) of the plurality of support units 7, the substrate W can be horizontally supported in a separated state by a certain distance (e.g., about 1 mm) from the tops of extending portions 5a of the spin base 5, while the films 28 are coming in contact with the underside of the substrate W.

On the other hand, when the drive unit 30 drives to lower the movable rods 29, the tips of the movable rods 29 are separated from the undersides of the tops of the cylindrical concave portions of the films 28, and the tops of the films 28 are then housed such that the tops of the films 28 are flush with the tops of the extending portions 5a. In this connection, when with at least three films 28 remaining projected, other films 28 of the support units 7 which have been projected, are lowered, the films 28 thus lowered can be separated from the underside of the substrate W. Each film 28 is made of a resilient resin having corrosion resistance against the treatment liquid. Preferably, a fluorine resin such as PCTFE (polychlorotrifluoroethylene) or the like is used.

The following description will discuss a processing (bevel processing) in which a treatment liquid is supplied to the underside of a substrate W, and then runs round up to the top thereof along the peripheral end face thereof to treat the top peripheral edge portion of the substrate W. Inert gas ejected from the gas ejection holes 9b toward the top of a substrate W is supplied to a non-treatment region NTR inward of a top treatment region TR processed with the treatment liquid which runs round up to the top peripheral edge portion of the substrate W. On the other hand, the support units 7 are disposed at the peripheral edge portion of the spin base 5 to support the substrate W in contact with the underside of the substrate W at its area corresponding to the non-treatment region NTR to which the inert gas is supplied. Such arrangement prevents the treatment liquid from entering the non-treatment region NTR, and also achieves the uniformity in width of the treatment liquid running from the peripheral end face of the substrate W in the radial direction. In this connection, the opposed face 9a of the atmosphere blocking plate 9 is recessed upwardly in the form of a step at the peripheral edge portion corresponding to the top treatment region TR such that the running-round of the treatment liquid is not obstructed.

In the method in which a substrate W is pressingly supported by the support units 7 in contact with the underside of the substrate W, inert gas is supplied into the space SP defined between the top of the substrate W and the opposed face 9a of the atmosphere intercepting plate 9, thereby to increase the inner pressure in the space SP. This causes the substrate W to be pressed to the support units 7. That is, there is no holding member such as a chuck pin or the like for supporting the substrate W and contacting with the outer peripheral end portion thereof, therefore, if the centrifugal force exerted on the substrate W exceeds the frictional force between the substrate W and the support units 7, there is a risk that the substrate W may fly out radially outwardly.

In order to avoid this risk, it is required that the center of the substrate W is previously aligned (centered) to the axis of rotation J of the spin chuck 4 with high precision.

Figure 4:
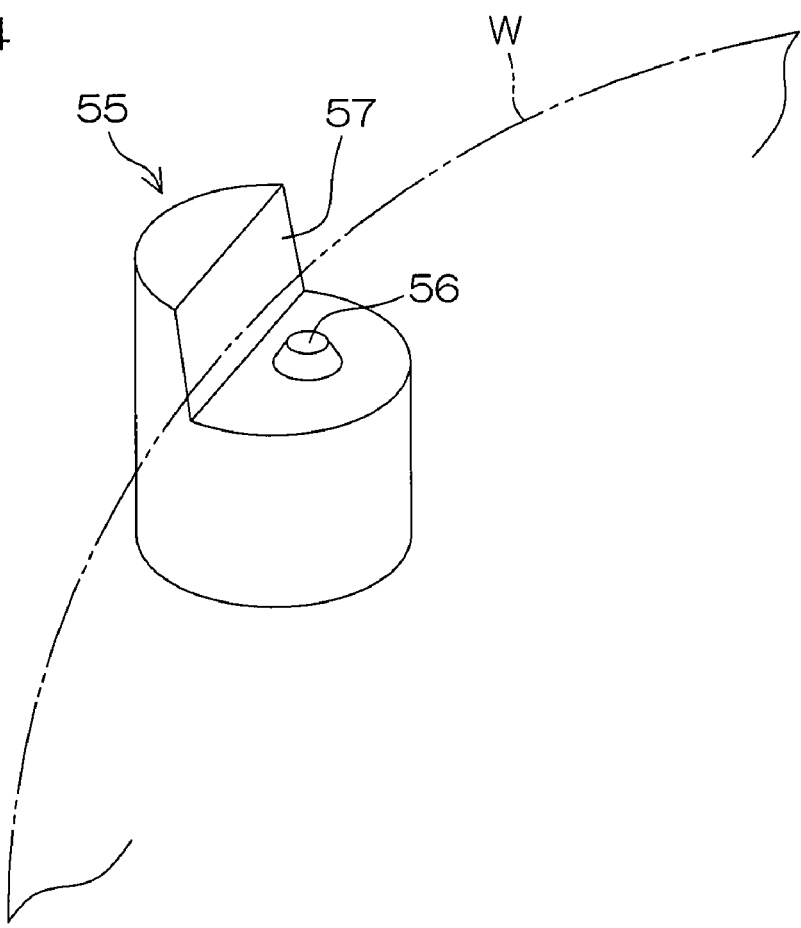
FIG. 4 is an enlarged perspective view of a positioning guide.

For such an alignment, the present embodiment has, a pair of positioning guides 55 on the top of the spin base 5, as shown in FIG. 2. Each positioning guide 55 has, as shown in the enlarged perspective view in FIG. 4: a substrate support 56 in a truncated-cone shape for supporting, the underside of the peripheral edge of a substrate W on a point contact, and a positioning face (guide face) 57 which is located radially outwardly of the substrate W with respect to the substrate support 56 to be opposite to the peripheral end face of the substrate W. The positioning face 57 is disposed at a position opposite to a substrate holding hand 60 which is arranged to access the spin chuck 4, and stands on the top of the spin base 5 so that, when the peripheral end face of a substrate W comes in contact with the positioning face 57, the center (gravity center) of the substrate W is aligned with the axis of rotation J of the spin base 5. To reduce the graze of the substrate W in its vertical movement, the positioning face 57 is inclined radially outwardly by about 5° with respect to the vertical plane. However, when the graze does not particularly cause a problem, the positioning face 57 may be vertical.

Further, in the present embodiment, a pair of positioning-time substrate holding pins 58 is disposed at the symmetrical positions to the pair of positioning guides 55 with respect to the axis of rotation J of the spin base 5. Each positioning-time substrate supporting pin 58 has a semi-spherical substrate support 59 for supporting, the peripheral edge portion of the underside of the substrate W on a point contact.

The substrate supports 56, 59 of the positioning guides 55 and the positioning-time substrate supporting pins 58 serve as to-be-positioned substrate supports for supporting the substrate W to come in contact with the peripheral edge portion of the underside of the substrate W when the substrate W is positioned. That is, the to-be-positioned substrate supports are arranged to come in contact with the underside of the substrate W with a certain substrate supporting height maintained with respect to the top of the spin base 5. The support units 7 for supporting a substrate W when the substrate W is processed are arranged to change the substrate supporting height (the top height of the film 28) between a processing position higher than the substrate supporting height provided by the positioning guides 55 and the positioning-time substrate supporting pins 58, and a retreat position lower than the substrate supporting height. The substrate supporting height of the support units 7 is controlled to the processing position when the substrate W is processed, and to the retreat position when the substrate W is aligned.

The substrate transfer robot 52 has the substrate holding hand 60 for holding and transferring a substrate W and a hand driving mechanism 53 for vertically and transversely moving the substrate holding hand 60. The hand driving mechanism 53 is controlled by the control unit 20. The substrate holding hand 60 serves to push the substrate W to the positioning faces 57 of the positioning guides 55. The substrate holding hand 60 has a pair of cantilevers 61 horizontally extending substantially in parallel to each other, and a cross beam 62 extending between the pair of cantilevers 61 at the base ends thereof.

Figure 5:
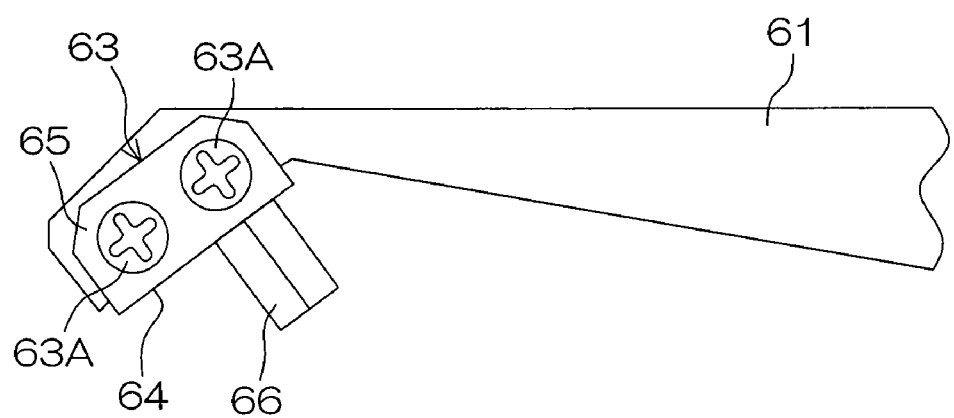
FIG. 5 is a plan view of a front-side dropping guide disposed on the substrate holding hand.

As enlargingly shown in FIG. 5, a dropping guide 63 for dropping and holding a substrate W is fixed at the tip of the cantilever 61 by bolts 63A. The dropping guide 63 has: a main body 65 having a regulating face 64 arranged to be opposite to the peripheral end face of the substrate W; and a support pawl 66 projecting from the vicinity of the lower edge of the main body 65 toward the center of the substrate W. The regulating face 64 is, for example, a vertical plane along the tangential direction of the peripheral end face of the substrate W. The top face of the support pawl 66 has a ridge line more inclined downwardly as more approaching the center of the substrate W and is made in a mountain-like tapering shape on the down grade at both sides of the ridge line. Thus, the support pawl 66 can support the lower edge of the substrate W on a point contact.

As shown in FIG. 2, a cylinder 70 for pushing out a substrate W toward the tip side of the substrate holding hand 60 is fixed in the vicinity of the intermediate portion of the cross beam 62. The operation of the cylinder 70 is controlled by the control unit 20. As shown in an enlarged plan view in FIG. 6(a) and in an enlarged side view in FIG. 6(b), the cylinder 70 expands and contracts a rod 71 substantially along the radial direction of the substrate W. A flange 72 is disposed in an intermediate portion of the rod 71. Further, a bracket 73 having an L-shape section is provided at the tip of the rod 71. The bracket 73 is axially slidably disposed on the rod 71. A coil spring 74 is wound on the rod 71 between the bracket 73 and the flange 72.

A dropping guide 75 (substrate contact portion) for supporting the substrate W is fixed to the bracket 73 by bolts 76. The dropping guide 75 has: a main body 78 having a regulating face 77 to be opposite to the peripheral end face of the substrate W; and a supporting pawl 79 projecting from the vicinity of the lower edge of the main body 78 toward the center of the substrate W. The regulating face 77 is, for example, a vertical plane extending in the tangential direction of the peripheral end face of the substrate W. The top face of the supporting pawl 79 is formed in a mountain-like tapering shape on the down grade at both sides of a ridge line 79a more inclined downwardly as more approaching the center of the substrate W, such that the lower edge of the substrate W can be supported on point contact by the ridge line 79a.

In association with the cylinder 70, sensors 81, 82 for detecting the position of the rod 71, and a sensor 83 for detecting the position of the dropping guide 75 are disposed. The sensor 81 is an advance-end sensor for detecting that the rod 71 is located in the advance end, and the sensor 82 is a retreat-end sensor for detecting that the rod 71 is located in the retreat end. The sensor 83 is a sensor to detect the relative position of the dropping guide 75 (or the bracket 73) with respect to the rod 71. More specifically, the sensor 83 is a clamp confirmation sensor for detecting the relative position of the dropping guide 75 at the time when the substrate W is clamped on the substrate holding hand 60 by the three dropping guides 63, 63, 75. That is, the clamp confirmation sensor 83 detects that the coil spring 74 is being compressed.

FIGS. 7 (a) to 7 (h) are schematic views successively illustrating the operational steps of transferring a substrate W from the substrate holding hand 60 to the spin chuck 4.

While the substrate holding hand 60 is transferring a substrate W, the control unit 20 controls the rod 71 of the cylinder 70 at the advance position. Accordingly, the substrate W is clamped on the substrate holding hand 60 by the dropping guides 63, 75 and resiliently held under the action of the coil spring 74. In such a state, the advance-end sensor 81 and the clamp confirmation sensor 83 are on, while the retreat-end sensor 82 is off. In FIGS. 7 (a) to 7 (h), each of the sensors as turned on is represented by a solid square ■, while each of the sensors as turned off is represented by an open square □.

The control unit 20 controls the hand driving mechanism 53 to guide the substrate holding hand 60 to the transfer position on the spin chuck 4. This is shown in FIG. 7(a). At this time, the substrate holding hand 60 holds the substrate W at a position higher than the upper ends of the positioning guides 55. Further, the control unit 20 controls such that the height of the support units 7 is located in the retreat position lower than the substrate supporting height of the substrate supports 56, 59 of the positioning guides 55 and the positioning-time substrate supporting pins 58.

Then, as shown in FIG. 7 (b), the control unit 20 controls such that the rod 71 of the cylinder 70 is located in the retreat position. Accordingly, the advance-end sensor 81 and the clamp confirmation sensor 83 are turned off, while the retreat-end sensor 82 is turned on. At this time, the regulating face 77 of the dropping guide 75 is retreated to a position separated from the peripheral end face of the substrate W, and the coil spring 74 is in a non-compressed state.

Then, the control unit 20 controls the hand driving mechanism 53 to lower the substrate holding hand 60 as shown in FIG. 7 (c). Accordingly, the substrate W is transferred from the dropping guides 63, 75 to the substrate supports 56, 59 of the positioning guides 55 and the positioning-time substrate supporting pins 58. The height of the substrate holding hand 60 is controlled such that the tops of the front dropping guides 63 are located in position lower than the underside of the substrate W. At this time, the regulating face 77 of the rear dropping guide 75 is opposite to the peripheral end face of the substrate W. That is, the regulating face 77 has such a height to be horizontally opposite to the peripheral end face of the substrate W even after the substrate holding hand 60 is lowered.

In this situation, the control unit 20 controls such that the rod 71 of the cylinder 70 is located in an advance position, as shown in FIG. 7 (d). Accordingly, the substrate W is pushed forward by the regulating face 77 of the rear dropping guide 75, and then slids on the substrate supports 56, 59 of the positioning guides 55 and the positioning-time substrate supporting pins 58. Accordingly, the substrate W moves toward the positioning faces 57 of the positioning guides 55. The advance position of the rod 71 in this situation is designed such that the peripheral end face of the substrate W having standard sizes reaches the positioning faces 57 with the coil spring 74 being in the expanded state (non-compressed state). Therefore, the advance-end sensor 81 is turned on; however, the clamp confirmation sensor 83 is maintained as turned off.

Then, the control unit 20 controls the hand driving mechanism 53 to advance the substrate holding hand 60 by a small distance (e.g., 2 mm) toward the positioning guides 55, as shown in FIG. 7 (e). Accordingly, even though the substrate W has a dimensional error within the tolerance, the regulating face 77 of the dropping guide 75 securely comes in contact with the peripheral end face of the substrate W. Further, by the coil spring 74 compressed with the advance movement of the substrate holding hand 60, the substrate W is resiliently biased toward the positioning guides 55. Thus, the substrate W securely comes in contact with the positioning guides 55 to complete the positioning of the substrate W. At this time, the clamp confirmation sensor 83 is turned on.

Then, as shown in FIG. 7 (f), the control unit 20 retreats the rod 71 of the cylinder 70 to retreat the regulating face 77 of the dropping guide 75 to a position separated from the peripheral end face of the substrate W. Accordingly, the advance-end sensor 81 and the clamp confirmation sensor 83 are turned off, and the retreat-end sensor 82 is turned on.

Further, the control unit 20 controls the hand driving mechanism 53 to lower further and then retreat the substrate holding hand 60 from the spin chuck 4 (FIG. 7 (g)).

Then, the control unit 20 controls the drive unit 30 (See FIG. 3) to raise the substrate supporting height of the support units 7 as shown in FIG. 7 (h). Accordingly, the substrate W is transferred to the support units 7 from the positioning guides 55 and the positioning-time substrate supporting pins 58.

Thus, the peripheral end face of the substrate W is pushed to the positioning faces 57 of the positioning guides 55, then the substrate W is transferred to the support units 7. Accordingly, the substrate W is supported having its center aligned with the axis of rotation J of the spin base 5.

Thereafter, the spin chuck 4 is slowly rotated one revolution, during which a substrate inclination sensor 86 checks whether or not the substrate W is inclined. The substrate inclination sensor 86 is formed, for example, with a pair of a light emitting element and a light receiving element. The light emitting element emits a light beam at a position higher by a small distance than the substrate supporting height provided by the support units 7 along a horizontal optical path passing above the substrate W. The light receiving element receives the light beam from the light emitting element. When the substrate W intercepts the light beam during one revolution of the spin base 5, the substrate W is judged as inclined to stop the processing. Otherwise, the substrate W is judged as properly held horizontally.

When the substrate W is properly held with no inclination, the substrate W is subjected to a processing using a treatment liquid with the spin base 5 rotated at a higher speed, and then to a shaking drying processing at a high-speed rotation.

FIGS. 8 (a) to 8 (f) are schematic views successively illustrating the operational steps of transferring a substrate W from the substrate holding hand 60 to the spin chuck 4 in the substrate processing apparatus according to a second embodiment of the present invention. In the following description of the second embodiment, reference is again made to FIG. 1 to FIG. 5, and FIGS. 6(a) and 6(b), and the parts corresponding to those shown in the drawings are designated by the same reference numerals also in FIGS. 8 (a) to 8 (f).

The second embodiment is arranged such that, at the time of positioning a substrate W with the use of positioning guides 55, the substrate W is slid on the support pawls 66, 79 of the dropping guides 63, 75 provided to substrate holding hand 60. That is, the support pawls 66, 79 are used as to-be-positioned substrate supporting members. Accordingly, each positioning guide 55 is not required to have a substrate support 56 in this embodiment. Further, the positioning-time substrate supporting pins 58 are neither required. Actually, however, the pins 58 are preferably disposed since the weight balance is preferably symmetric with respect to the axis of rotation J.

Figure 6A:
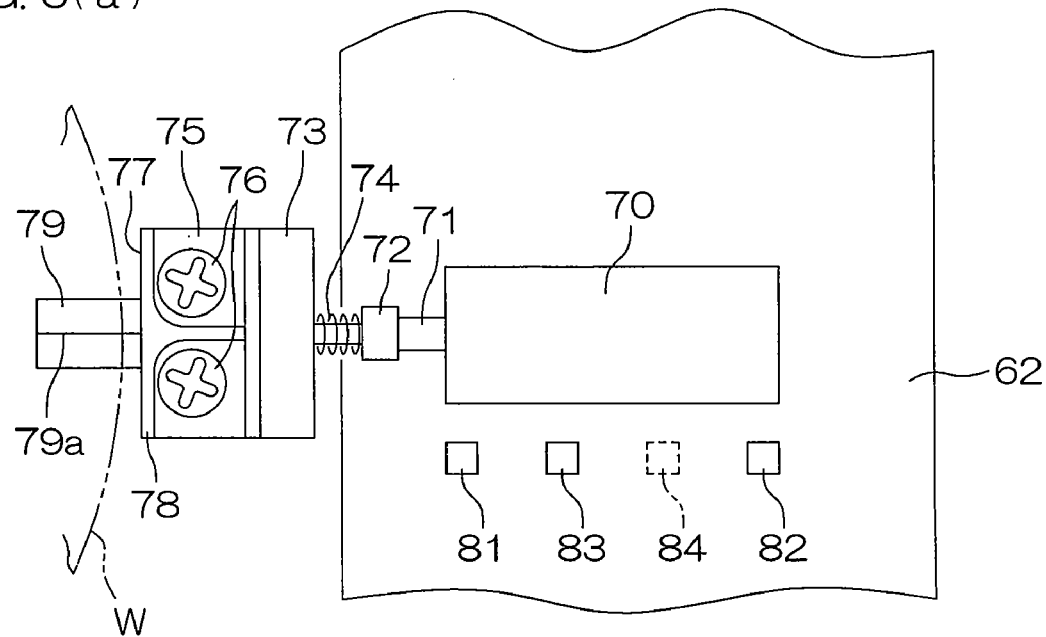
FIGS. 6 (a) and 6 (b) are enlarged views illustrating the arrangement relating to a rear-side dropping guide disposed on the substrate holding hand.
Figure 6B:
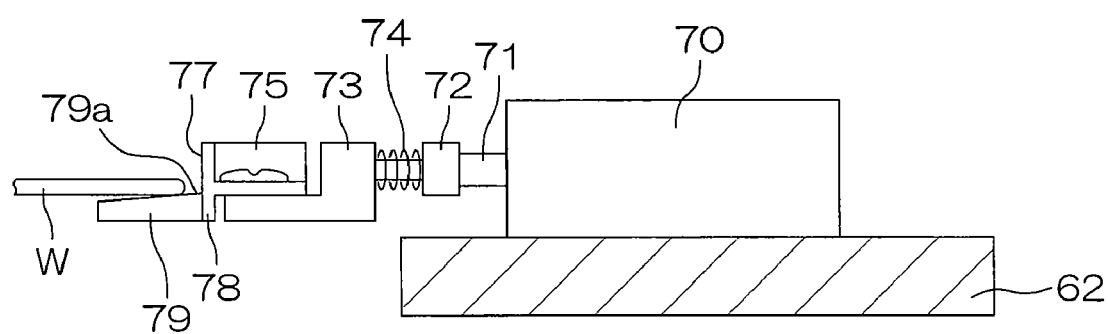

Further, in the second embodiment, a positioning confirmation sensor 84 is disposed in association with the cylinder 70, in addition to the sensors 81 to 83, as shown by a two-dot chain line in FIG. 6(a). The positioning confirmation sensor 84 is a sensor to detect the relative position of the dropping guide 75 with respect to the rod 71 of the cylinder 70. More specifically, the positioning confirmation sensor 84 detects the position where the dropping guide 75 is further retreated toward the main-body side of the cylinder 70, as compared with the position where the substrate W is clamped on the substrate holding hand 60 by the three dropping guides 63, 63, 75 (the clamp confirmation sensor 83 is on). In other words, the positioning confirmation sensor 84 detects the status where the coil spring 74 is compressed more than at the time when the substrate W is clamped.

Similar to the first embodiment mentioned above, when the substrate holding hand 60 transfers the substrate W, the control unit 20 controls the rod 71 of the cylinder 70 to be in the advance position. Accordingly, the substrate W is clamped on the substrate holding hand 60 by the dropping guides 63, 75. Therefore, the coil spring 74 is in a slightly compressed state. In this situation, the advance-end sensor 81 and the clamp confirmation sensor 83 are on, while the positioning confirmation sensor 84 and the retreat-end sensor 82 are off.

Figure 8A:
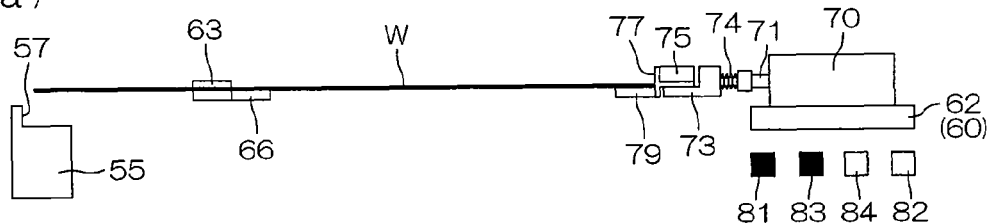
FIGS. 8 (*a*) to 8 (*f*) are schematic views successively illustrating the operational steps (according to a second embodiment) of transferring a substrate from the substrate holding hand to the spin chuck.
Figure 8B:
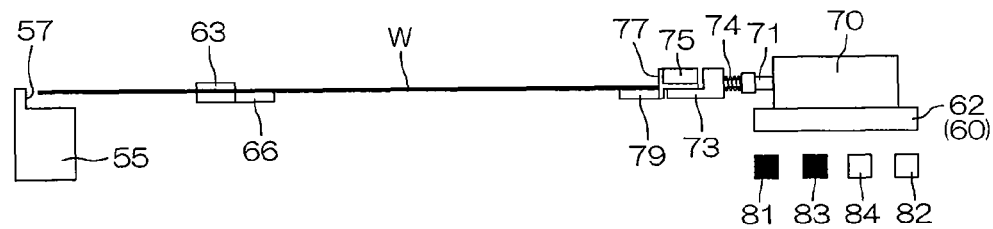

As shown in FIG. 8(a), the control unit 20 controls the hand driving mechanism 53 to guide the substrate holding hand 60 to the transfer position on the spin chuck 4. At this time, the substrate holding hand 60 holds the substrate W at a position higher than the upper ends of the positioning guides 55. The control unit 20 controls the substrate supporting height of the support units 7 to be located in the retreat position lower than the substrate supporting height of the substrate supports 56, 59 of the positioning guides 55 and the positioning-time substrate supporting pins 58.

Then, the control unit 20 controls the hand driving mechanism 53 to lower the substrate holding hand 60 to a positioning height, as shown in FIG. 8 (b). The positioning height refers to a height where the peripheral end face of the substrate W is horizontally opposite to the positioning faces 57 of the positioning guides 55 and the substrate W is supported by the support pawls 66, 79 of the dropping guides 63, 75. This positioning height is higher than any of the substrate supporting height of the support units 7 and the substrate supporting height of the substrate supports 56, 59 of the positioning guides 55 and the positioning-time substrate supporting pins 58.

Figure 8C:
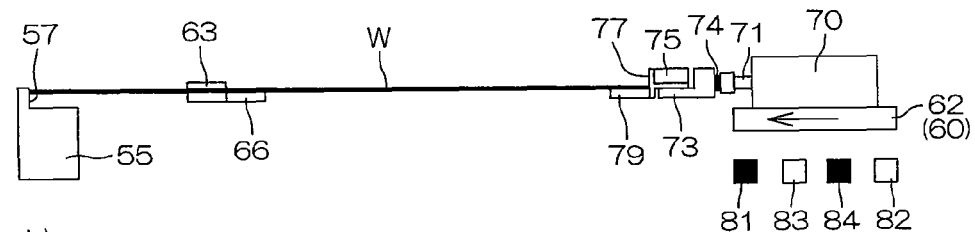
Figure 8D:
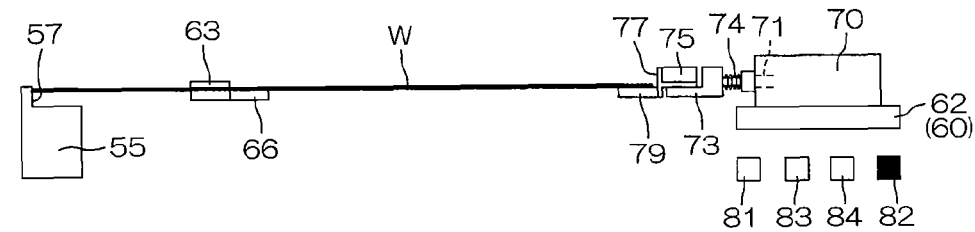
Figure 8E:
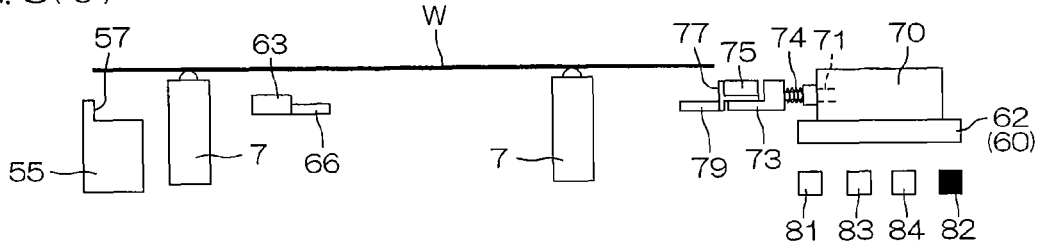

In this situation, the control unit 20 controls the hand driving mechanism 53 to advance the substrate holding hand 60 by a small distance (e.g., 4 mm) as shown in FIG. 8(c). In this process, the peripheral end face of the substrate W comes in contact with the positioning faces 57 of the positioning guides 55, and thereafter, the substrate holding hand 60 advances while compressing the coil spring 74. With this advance, the front-side peripheral end face of the substrate W is separated from the regulating faces 64 of the dropping guides 63. Thus, the front-side peripheral end face of the substrate W comes in contact with the positioning faces 57 to complete the positioning of the substrate W. In this situation, the advance-end sensor 81 is on, the clamp confirmation sensor 83 off, the positioning confirmation sensor 84 on and the retreat-end sensor 82 off.

Then, the control unit 20 controls the rod 71 of the cylinder 70 to be in the retreat position as shown in FIG. 8 (d). Accordingly, the advance-end sensor 81, the clamp confirmation sensor 83 and the positioning confirmation sensor 84 are turned off, and the retreat-end sensor 82 is turned on. The regulating face 77 of the dropping guide 75 is retreated to a position separated from the peripheral end face of the substrate W, and the coil spring 74 is brought to a non-compressed state.

Further, the control unit 20 controls the drive unit 30 (See FIG. 3) to raise the supporting height of the support units 7. Accordingly, the substrate W is transferred from the dropping guides 63, 75 to the support units 7 (FIG. 8(e)).

Figure 8F:
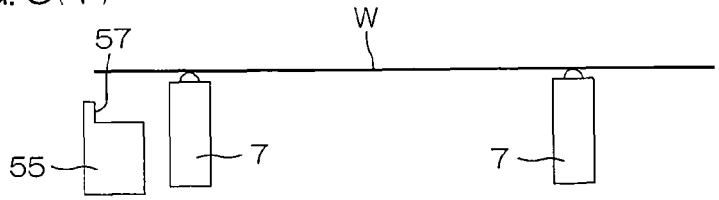

Thereafter, the control unit 20 controls the hand driving mechanism 53 to lower further and then retreat the substrate holding hand 60 from the spin chuck 4 (FIG. 8(f)).

Thus, the peripheral face of the substrate W is pushed to the positioning faces 57 of the positioning guides 55, then the substrate W is transferred to the support units 7. Accordingly, the substrate W to be supported having its center aligned with the axis of rotation J of the spin base 5.

The subsequent operations are similar to those in the first embodiment.

In the first embodiment mentioned earlier, wherein the substrate W is positioned, the substrate W is slid on the substrate supports 56, 59 of the positioning guides 55 and the positioning-time substrate supporting pins 58. In the second embodiment, however, the substrate W is positioned, while the substrate W is slid on the support pawls 66, 79 of the dropping guides 63, 75 of the substrate holding hand 60. In view of this difference, the second embodiment is advantageous in the following points.

Firstly, the contact with the underside of the substrate W is less. This is advantageous particularly in the following case. That is, there are instances where the substrate W is provided with a notch (e.g., a notch representing a crystal orientation of a semiconductor) in the peripheral end face. In such a case according to the first embodiment, to securely position the substrate W regardless of the substrate direction, the substrate supports 56, 59 are required, to support the underside of the substrate W at its comparatively inward area. According to the second embodiment, however, the substrate W can be slid with its lower edge coming on point contact with the support pawls 66, 79 provided to the substrate holding hand 60, which avoids the contact with the inner area of the substrate underside. For example, the support units 7 which support the substrate W under processing, come in contact with the substrate W underside at its peripheral region having a predetermined width (e.g., 2 mm) from the peripheral end face of the substrate W. In this case, to support the substrate W by the substrate supports 56, 59, it is inevitable to support the substrate underside at its region inward of the support units 7. However, such difficulty does not arise in the second embodiment in which the substrate W is solid to be positioned on the substrate holding hand 60.

Secondly, the change with time in the positioning precision can be restrained. The positioning guides 55 and the positioning-time substrate supporting pins 58 are exposed to a chemical during the processing of the substrate W, and are therefore required to be made of a material having a chemical resistance (e.g., fluororesin). However, such a material is not necessarily sufficient in wear resistance. Accordingly, the positioning precision may be deteriorated by wear due to repeated use. On the contrary, the support pawls 66, 69 of the substrate holding hand 60 do not come in direct contact with chemicals. Accordingly, the material can be selected with preference given to the wear resistance over the chemical resistance. Accordingly, the positioning precision can be maintained for a long period of time.

In the foregoing, the description has been made of two embodiments of the present invention, but the present invention may also be implemented in other forms. In the above-mentioned embodiments, for example, the substrate holding and rotating mechanism has been discussed in the form of the spin chuck 4 arranged to support the substrate W while coming in contact with only the peripheral edge portion of the underside of the substrate W. However, the present invention may also be applied to a substrate processing apparatus having a spin chuck of other types, such as a mechanical chuck for holding the peripheral end face of the substrate W by a plurality of holding members, a vacuum chuck for vacuum-adsorbing the underside of the substrate W, or the like.

Further, the first embodiment is arranged to press the substrate W to the positioning faces 57 of the positioning guides 55 by advancing both the substrate holding hand 60 and the rod 71 of the cylinder 70. However, provision may be made such that the substrate W is pushed to the positioning faces 57 by advancing either one of the substrate holding hand 60 and the rod 71.

Further, the first embodiment is arranged to position the substrate W while the substrate W is being slid on the substrate supports 56, 59 of the positioning guides 55 and the positioning-time substrate supporting pins 58. However, the substrate W to be positioned may be slid while being supported by the support units 7. In this case, the positioning-time substrate supporting pins 58 are not required and the positioning guides 55 are not required to have the substrate supports 56.

In each of the first and second embodiments, the rear-side dropping guide 75 has the supporting pawl 79 for supporting the lower edge of the substrate W and the regulating face 77. Thus, the guide 75 has both a substrate supporting function and a function as a substrate contact portion which comes in contact with the substrate W when pushing the same to the positioning guides 55. However, these functions may be respectively executed by individual members. For example, the substrate contact portion having no substrate supporting function may be connected to the rod 71 of the cylinder 70 through the bracket 73, and a pair of dropping guides may be fixed to the cross beam 62 (See FIG. 2) at both sides of the cylinder 70. In this case, the substrate contact portion may have the arrangement, for example, of the dropping guide 75 with the supporting pawl 79 removed.

In the above-mentioned embodiments, the dropping guide 75 serving as the substrate contact member is advanced and retreated by the cylinder 70. However, a drive unit other than the cylinder may be used, such as a motor or the like.

In the above-mentioned embodiments, to change the substrate supporting height of the support units 7, the drive unit 30 such as a motor or the like is incorporated in the spin base 5. However, an arrangement may be used in which the drive force from a drive mechanism disposed outside of the spin base 5 is transmitted to the support units 7 through a link mechanism or the like disposed inside of the spin base 5, thereby to change the substrate supporting height of the support units 7. More specifically, using the structure disclosed in U.S. Patent Application Publication No. US2004/0159343 A1 which is incorporated herein by reference, for example, the drive force from the drive mechanism disposed outside of the spin base 5 may be transmitted to the link mechanism disposed inside of the spin base 5.

Embodiments of the present invention have been discussed in detail, but these embodiments are mere specific examples for clarifying the technical contents of the present invention. Therefore, the present invention should not be construed as limited to these specific examples. The spirit and scope of the present invention are limited only by the appended claims.

This Application corresponds to Japanese Patent Application No. 2006-89049 filed with the Japanese Patent Office on 28 Mar. 2006, the entire disclosure of which is incorporated herein by reference.

I claim:

1. A substrate processing apparatus, comprising:
    a substrate holding and rotating mechanism, having a spin base arranged to rotate around an axis of rotation, for holding and rotating a substrate;
    at least two positioning members provided on the substrate holding and rotating mechanism for positioning the substrate at a predetermined substrate holding position, the positioning members being fixed to the spin base such that the positioning members are unmovable relative to the spin base, with a first distance between the positioning members;
    a substrate transfer mechanism for transferring the substrate to the substrate holding and rotating mechanism;
    a pressing unit disposed on the substrate transfer mechanism for pressing the substrate toward the positioning members in a pressing direction; and
    a control unit programmed to execute a step of pressing a substrate to the positioning members by use of the pressing unit disposed on the substrate transfer mechanism, wherein
    the substrate transfer mechanism includes a substrate holding hand for holding the substrate,
    the substrate holding hand includes a substrate contact portion provided at a base end of the substrate holding hand and arranged to come in contact with an end face of the substrate, and a pair of support members provided at a tip end of the substrate holding hand with a second distance between said support members longer than the first distance,
    the pressing unit includes a substrate-contact-portion moving mechanism for moving the substrate contact portion toward the positioning members, and
    the at least two positioning members are disposed between the pair of support members when viewed in the pressing direction.

2. A substrate processing apparatus according to claim 1, wherein
    the substrate-contact-portion moving mechanism comprises a hand driving mechanism for moving the substrate holding hand toward the positioning member.

3. A substrate processing apparatus according to claim 2, wherein the substrate-contact-portion moving mechanism further comprises a relative moving mechanism for relatively moving the substrate contact portion with respect to the substrate holding hand.

4. A substrate processing apparatus according to claim 1, wherein
    the substrate-contact-portion moving mechanism comprises a relative moving mechanism for relatively moving the substrate contact portion with respect to the substrate holding hand.

5. A substrate processing apparatus according to claim 1, further comprising a to-be-positioned substrate supporting portion for supporting the substrate movably toward the positioning member at a position where an end face of the substrate is opposite to the positioning member.

6. A substrate processing apparatus according to claim 5, wherein the to-be-positioned substrate supporting portion is disposed on the substrate holding and rotating mechanism.

7. A substrate processing apparatus according to claim 5, wherein the to-be-positioned substrate supporting portion is disposed on the substrate transfer mechanism.

8. A substrate processing apparatus according to claim 1, wherein the substrate holding and rotating mechanism comprises a to-be-processed substrate supporting portion for supporting the substrate while coming in contact with one surface of the substrate when the substrate is processed.

9. A substrate processing apparatus according to claim 8, further comprising a fluid supply unit for supplying a fluid to the other surface of the substrate supported by the to-be-processed substrate supporting portion, such that the substrate is pressed to the to-be-processed substrate supporting portion.

* * * * *